United States Patent
Wen

(10) Patent No.: US 7,790,621 B2
(45) Date of Patent: Sep. 7, 2010

(54) ION IMPLANTATION FOR INCREASING ETCH RATE DIFFERENTIAL BETWEEN ADJACENT MATERIALS

(76) Inventor: Sophia Wen, 16262 SE. Bluff Rd., Sandy, OR (US) 97055

( * ) Notice: Subject to any disclaimer, the term of this patent is extended or adjusted under 35 U.S.C. 154(b) by 761 days.

(21) Appl. No.: 11/710,271

(22) Filed: Feb. 23, 2007

(65) Prior Publication Data

US 2007/0202707 A1    Aug. 30, 2007

Related U.S. Application Data

(60) Provisional application No. 60/776,035, filed on Feb. 23, 2006.

(51) Int. Cl.
*H01L 21/302* (2006.01)
*H01L 21/461* (2006.01)

(52) U.S. Cl. .................. 438/745; 438/753

(58) Field of Classification Search ............ None
See application file for complete search history.

(56) References Cited

U.S. PATENT DOCUMENTS

| 4,303,933 | A | * | 12/1981 | Horng et al. | ............ 257/514 |
| 4,800,170 | A | * | 1/1989 | Jain et al. | ............ 438/694 |
| 5,413,953 | A | * | 5/1995 | Chien et al. | ............ 438/443 |
| 5,436,174 | A | * | 7/1995 | Baliga et al. | ............ 438/705 |
| 5,488,004 | A | * | 1/1996 | Yang | ............ 438/162 |

\* cited by examiner

*Primary Examiner*—Duy-Vu N Deo
(74) *Attorney, Agent, or Firm*—Raymond J. Werner

(57) ABSTRACT

Ion implantation is used to modify the chemical properties of portions of a material, such that the modified portions respond differently to a chemical etching operation than do the unmodified portions of the material. In a further aspect of the present invention, ion implants into a wafer are performed at different energies so as to form three-dimensional patterns of chemically modified material within the body of a wafer. In a still further aspect of the present invention, three-dimensional patterns of etched tunnels within a wafer are formed, and in some embodiments provide for reduced parasitic capacitance and/or reduced leakage currents for electronic circuits.

14 Claims, 4 Drawing Sheets

ION IMPLANTATION FOR INCREASING ETCH RATE DIFFERENTIAL BETWEEN ADJACENT MATERIALS

CROSS-REFERENCE TO RELATED APPLICATIONS

This non-provisional application claims the benefit of earlier filed U.S. provisional application No. 60/776,035; filed 23 Feb. 2006; and entitled "Chemical Etching For Semiconductor Chips"; the entirety of which is hereby incorporated by reference.

FIELD OF THE INVENTION

The present invention generally relates to manufacturing methods for semiconductor devices and microelectromechanical systems, and more particularly relates to methods of modifying etch rate characteristics of materials and structures formed from such modified materials.

BACKGROUND

It is well known that the manufacture of semiconductor electronic components involves a number of steps, including but not limited to, masking, implanting, depositing, planarizing, and etching.

Advances in semiconductor manufacturing processes, and in digital systems architectures, have resulted in vast increases in computational power and similarly large decreases in prices for electronic products. The capabilities offered by this combination of high performance and low cost have driven semiconductor components into a wide array of consumer electronics products.

While many suppliers of consumer electronics products have benefited from the increased volume of product shipments, the semiconductor manufacturers have realized that serving the consumer market places tight constraints on the cost of producing the semiconductor components that are incorporated into such consumer electronics products.

What is needed are methods for reducing the costs of manufacturing semiconductor components and microelectromechanical systems.

SUMMARY OF THE INVENTION

Briefly, ion implantation is used to modify the chemical properties of portions of a material, such that the modified portions respond differently to a chemical etching operation than do the unmodified portions of the material.

In a further aspect of the present invention, ion implants into a wafer are performed at different energies so as to form three-dimensional patterns of chemically modified material within the body of a wafer.

In a still further aspect of the present invention, three-dimensional patterns of etched tunnels within a wafer are formed, and in some embodiments provide for reduced parasitic capacitance and/or reduced leakage currents for electronic circuits.

DETAILED DESCRIPTION

Figure 1:
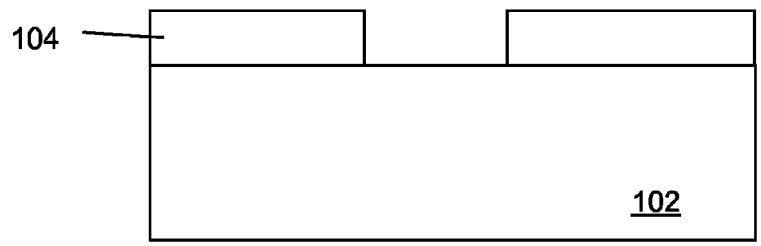
FIG. 1 is a cross-sectional view of a wafer with a patterned masking layer disposed thereon.

Generally, an ion implantation of one or more species into a material is performed to modify portions of that material such that the etch rate of the modified and unmodified materials in a subsequent wet chemical etch are different. In some embodiments, the etch rate of the modified material is greater than the etch rate of the unmodified material. However, the present invention is not limited to increasing the etch rate of the modified material. Various embodiments of the present invention provide for combinations of implanted species and wet chemical etch systems such that the modified material may have an etch rate that is less than that of the unmodified material.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Various aspects of the illustrative embodiments of the present invention are described with specific numerical values representing parameters such as, for example, length or radius. Where these values are described herein as being 'nominal', it is meant that the specified value is intended but that it is recognized that slight variations due to actual manufacturing tolerances are to be expected. The nominal values presented comprehend and include the ranges inherent in the manufacturing processes used to prepare and provide the various components of the illustrative embodiments.

TERMINOLOGY

The terms chip, integrated circuit, semiconductor device and microelectronic device are also sometimes used interchangeably in this field. The present invention relates to the manufacture of chips, integrated circuits, semiconductor devices and microelectronic devices as these terms are commonly understood in the art.

Substrate, as used herein, refers to the physical object which is the basic workpiece that is transformed by various process operations into the desired microelectronic configuration. For semiconductor and microelectromechanical systems, a substrate may be a wafer. Wafers, may be made of semiconducting, non-semiconducting, or combinations of semiconducting and non-semiconducting materials.

Polycrystalline silicon is a nonporous form of silicon made up of randomly oriented crystallites or domains. Polycrystalline silicon is often formed by chemical vapor deposition from a silicon source gas, or other methods, and has a structure that contains large-angle grain boundaries, twin boundaries, or both. Polycrystalline silicon is often referred to in this field as polysilicon, or sometimes more simply as poly.

The term vertical, as used herein, means substantially perpendicular to the surface of a substrate.

FET, as used herein, refers to metal-oxide-semiconductor field effect transistors (MOSFETs). These transistors are also known as insulated gate field effect transistors (IGFETs).

S/D refers to the source and/or drain junctions that form two of the four terminals of a FET. Source/drain terminals refer to the terminals of a FET, between which conduction occurs under the influence of an electric field, subsequent to the inversion of the semiconductor surface under the influence of an electric field resulting from a voltage applied to the gate terminal. Generally, the source and drain terminals are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

Figure 2:
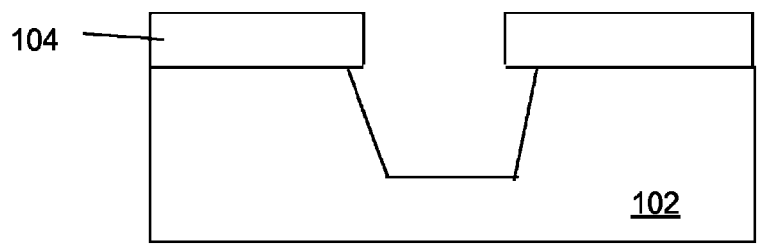
FIG. 2 is a cross-sectional view of the wafer of FIG. 1 after a wet chemical etching process produces an isotropic trench, i.e., sloping sidewalls due to lateral etching.

Referring to FIGS. 1 and 2, cross-sectional views of a wafer 102 with a patterned masking layer 104 disposed thereon is shown before and after a wet chemical etching process produces an isotropic trench 202, i.e., sloping sidewalls due to lateral etching. The conventional wet etching process illustrated in FIGS. 1-2, produces sloped walls because the chemical etchants react with the wafer material in all directions, the regions closer to the surface are in contact with the wet chemical etchants for a longer period of time, and therefore lateral etching takes place. To overcome the dimensional control problems that wet etching presents, plasma etching processes have been developed. Plasma etching processes that remove material primarily through surface bombardment, rather than chemical reaction as in the conventional wet etching processes, have been used to produce trenches, or openings with sidewalls that are substantially vertical. This type of etching is referred to as anisotropic.

In accordance with the present invention, ion implantation changes the properties of the target materials such that wet chemical etching becomes an anisotropic process. Various embodiments of the present invention can be used to replace plasma etching while maintaining the desired dimensional control and lowering cost of operation.

Figure 3:
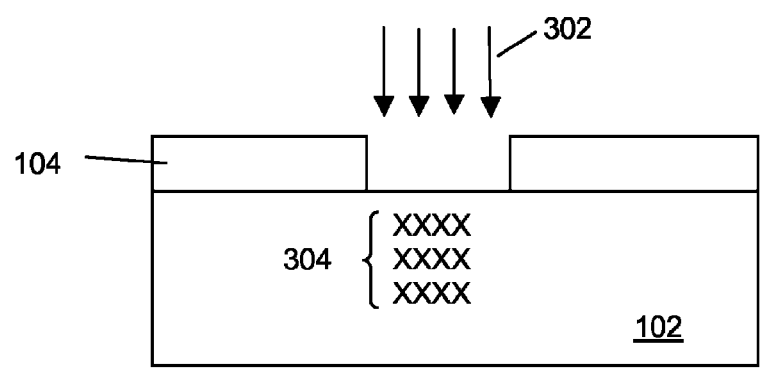
FIG. 3 is a cross-sectional view of a wafer with a patterned masking layer disposed thereon and further showing an ion implantation into the wafer.

Referring to FIG. 3 a cross-sectional view of a wafer 102 with a patterned masking layer 104 disposed thereon. Patterned masking layer 104 may be formed of any suitable material or combination of materials, as long as it serves to substantially block ion implantation 302. FIG. 3 further shows ion implantation 302 disposing one or more implant species into a region 304 of wafer 102. In one embodiment, wafer 102 is a silicon wafer and the implant species is oxygen.

Figure 4:
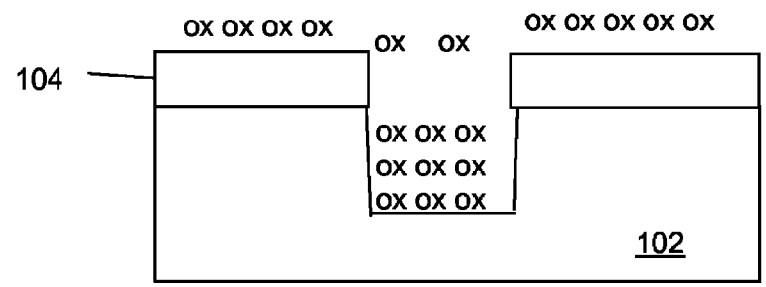
FIG. 4 is a cross-sectional view of the wafer of FIG. 3 showing a wet chemical etching process that reacts with, and removes, portions of the wafer modified by ion implantation at a rate greater than the rate at which the unmodified portions are etched.
Figure 5:
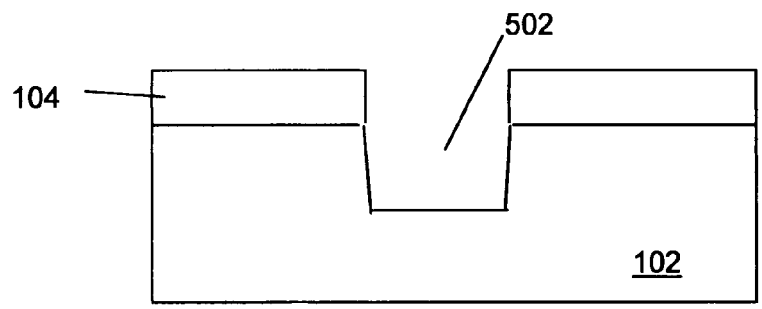
FIG. 5 is a cross-sectional view of the wafer of FIG. 4 after the wet chemical etching process produces a substantially anisotropic trench, i.e., the sidewalls are substantially vertical.
Figure 6:
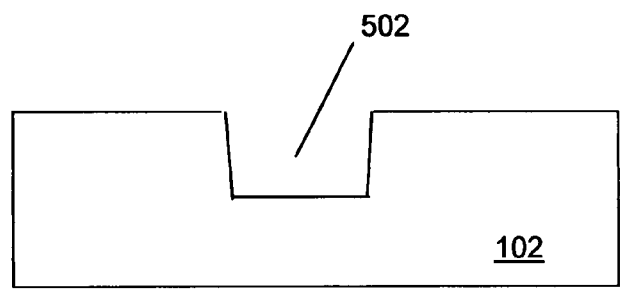
FIG. 6 is a cross-sectional view of the wafer of FIG. 5 after the masking layer has been removed.

FIG. 4 shows wafer 102 of FIG. 3 wherein a wet chemical etching process reacts with, and removes, the portions of wafer 102 that have been modified by ion implantation at a rate greater than the rate at which the unmodified portions are etched. FIG. 5 shows wafer 102 of FIG. 4 after the wet chemical etching process produces a substantially anisotropic trench, or opening 502. It is noted that the sidewalls of trench 502 are substantially vertical. FIG. 6 shows wafer 102 of FIG. 5 after masking layer 104 has been removed.

In one illustrative example, oxygen ions are implanted into predetermined areas of a polysilicon layer. The oxygen and silicon may react to form oxides of silicon. The polysilicon layer is exposed to a wet etching process in which hydrofluoric acid is used. The hydrofluoric acid preferentially etches the silicon oxides rather than silicon, therefore the implanted areas will react with the chemical solution and be etched away. Ion implantation processes can place the implanted species into small areas of a substrate with precision. Since such implants are precisely located within a substrate, and further because the presence of such implants modifies the chemical properties of the implanted area, various embodiments of the present invention provide the ability to produce structures with the desired degree of anisotropy with wet chemical etching.

In another illustrative example, nitrogen dioxide is implanted into predetermined areas of a polysilicon area. The nitrogen dioxide molecules are disposed among the silicon atoms of the polysilicon without a significant degree of chemical interaction. Exposing the polysilicon layer to a wet etching process in which hydrofluoric acid is used. When the hydrofluoric acid solution reaches the implanted areas, the implanted nitrogen dioxide may dissolve into the water of the hydrofluoric acid solution to form nitric acid. It is noted that polysilicon dissolves in a solution of nitric acid and hydrofluoric acid, but not in either nitric acid or hydrofluoric acid alone. Since the areas of polysilicon implanted with nitrogen dioxide form nitric acid when exposed to a hydrofluoric acid solution, it is those areas which are exposed to the combination of nitric acid and hydrofluoric acid, and consequently those areas are selectively etched.

Figure 7:
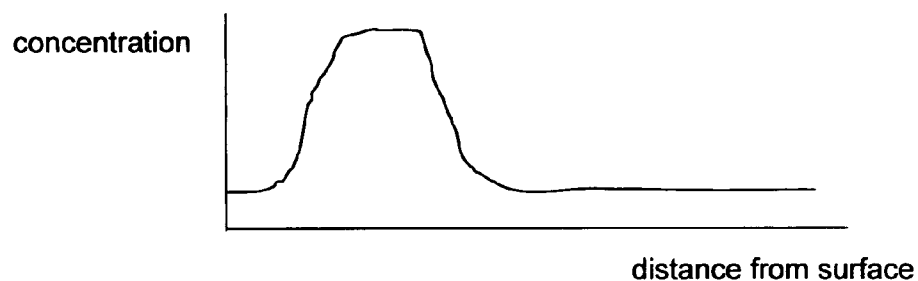
FIG. 7 is a diagram illustrating a doping profile (i.e., concentration of implanted species versus distance from surface of the wafer) resulting from an ion implant operation performed at a particular energy.
Figure 8:
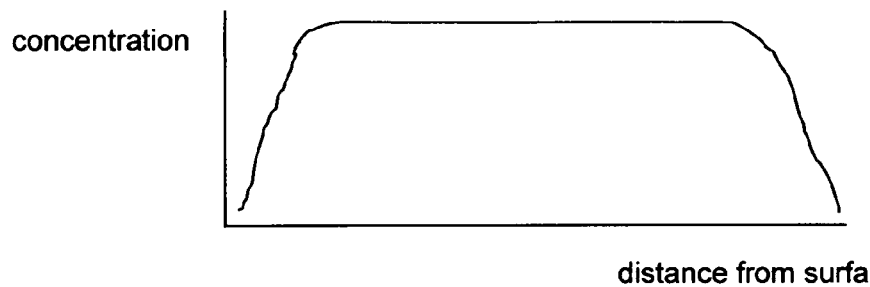
FIG. 8 is a diagram illustrating a doping profile produced from ion implantation over a range of energies, resulting in a doping concentration substantially independent of distance from the surface.
Figure 9:
FIG. 9 is a diagram illustrating a doping profile produced from ion implantation over a range of energies, resulting in a doping concentration substantially linearly increasing with increasing distance from the surface.

It is noted that ion implantation processes are commonly specified by identifying the species (atoms or molecules) to be implanted, along with the dose and energy. The greater the implant energy the deeper into the substrate the atoms or molecules are placed. In accordance with the present invention, the implant energy may be varied so as to achieve the desired doping profile (i.e., concentration of implanted species versus distance from surface of the wafer). FIG. 7 is a diagram illustrating a doping profile resulting from an ion implant operation performed at a particular energy. It can be seen that the concentration of implanted species peaks within a predetermined range of distance from the surface of the substrate. FIG. 8 shows a diagram illustrating a doping profile produced from ion implantation over a range of energies, resulting in a doping concentration substantially independent of distance from the surface. In other words, by implanting at a series of energies, the dopant species can be delivered at the desired concentrations at the desired depths. FIG. 9 shows an alternative doping profile produced from ion implantation over a range of energies, resulting in a doping concentration substantially linearly increasing with increasing distance from the surface. Those skilled in the art and having the benefit of the present disclosure will appreciate that by adjusting ion implant parameters a wide variety of essentially arbitrary doping profiles may be obtained.

Figure 10:
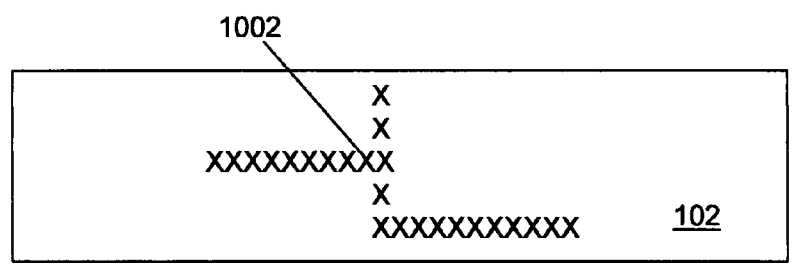
FIG. 10 is a cross-sectional view of a wafer that has been ion implanted at different energies to create a three-dimensional pattern within the body of the wafer.
Figure 11:
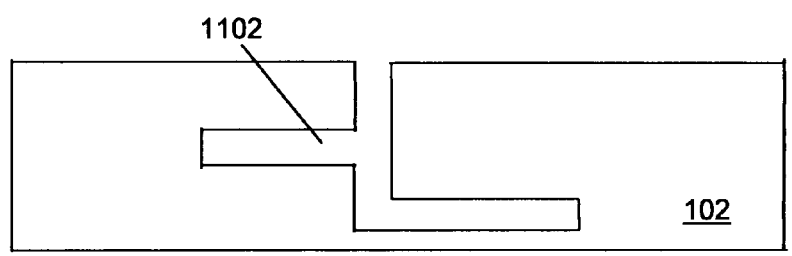
FIG. 11 is a cross-sectional view of the wafer of FIG. 10 after a wet chemical etching operation has been performed.

Referring to FIG. 10, a cross-sectional view of wafer 102 which has been ion implanted at different energies to create a three-dimensional pattern 1002 within the body of wafer 102 is shown. Three-dimensional pattern 1002 has a vertical shaft region with horizontally oriented regions extending laterally therefrom. A plurality of implant energies are used to set the depth of the horizontally oriented regions. This implanted region 1002 has an etch rate in a subsequently provided wet chemical etchant solution that is different than the etch rate of the first material in the wet chemical etchant. FIG. 11 is a cross-sectional view of the wafer of FIG. 10 after a wet chemical etching operation has been performed thereby producing a three-dimensional network of tunnels 1102. In one illustrative embodiment in accordance with the present invention, a substrate comprising a first material is provided and a patterned implant mask is formed on a first surface of the substrate. Ion implanting of at least one species of dopant into the substrate through the openings of the implant mask is then performed. In this illustrative embodiment the substrate is then annealed to repair crystal damage that may have been caused by high energy ion implantation. Typically, wafers in the semiconductor manufacturing process have FETs formed thereon. Formation of source/drain regions in the substrate is performed as part of the process steps for the making FETs. The substrate is then exposed to a wet chemical etchant solution so that region 1002 is etched. By creating tunnels 1102 under the source/drain regions, reductions in both parasitic capacitance and leakage currents to the substrate may be obtained.

In an alternative embodiment, vias through a substrate are formed. In this alternative embodiment a substrate comprising a first material is provided and an implant mask is formed on a first surface of the substrate, wherein the implant mask has openings through which portions of the substrate are exposed. Ion implanting is then performed at a plurality of energies, such that at least one species of dopant is implanted into exposed portions of the substrate. Well-known semiconductor manufacturing steps are performed so that source/drain regions are formed in the substrate. A wet chemical etchant solution is then applied to the first surface of the substrate. In this embodiment, the implanted regions of the substrate have an etch rate in the wet chemical etchant solution that is different than the etch rate of the first material in the wet chemical etchant. In various embodiments the substrate may be annealed before the source/drain regions are formed.

Figure 12:
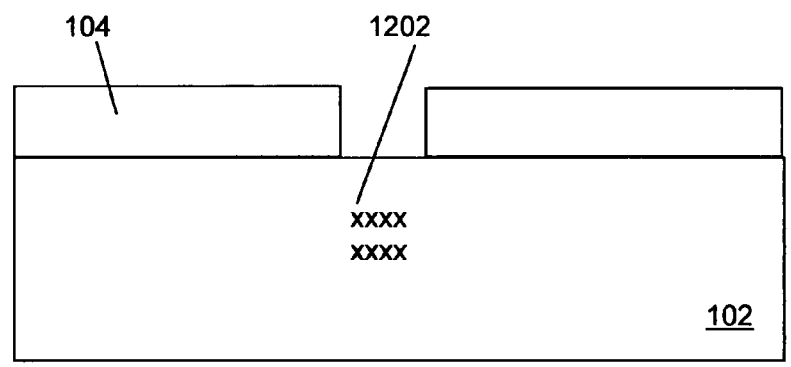
FIG. 12 is a cross-sectional view of a wafer with a patterned masking layer disposed thereon, and a concentration peak of implanted species disposed at a predetermined distance from the surface.
Figure 13:
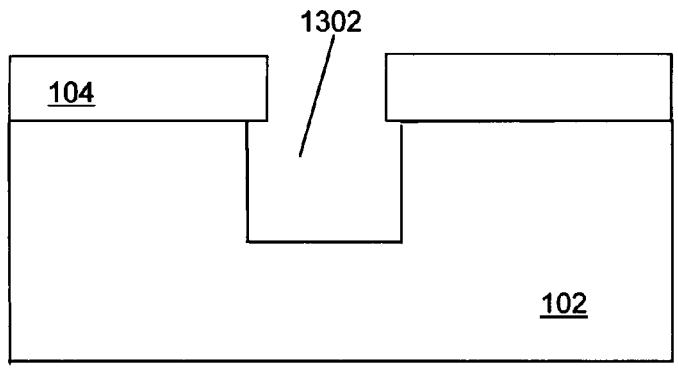
FIG. 13 is a cross-sectional view of the wafer of FIG. 12 after a wet chemical etching operation has been performed.

FIG. 12 is a cross-sectional view of wafer 102 with a patterned masking layer 104 disposed thereon, and a concentration peak of implanted dopant 1202 disposed at a predetermined distance from the surface. FIG. 13 is a cross-sectional view of wafer 102 of FIG. 12 after a wet chemical etching operation has been performed and produced a trench 1302 with substantially vertical sidewalls that are each recessed back from the opening defined by implant mask 104. In this embodiment, the implanted dopant increases the etch rate of the substrate. Since the dopant is placed within the substrate a predetermined distance away from the surface, and further because it accelerates etching compared with the etch rate of the material disposed above, substantially vertical sidewalls are still obtained even though there is some lateral etching above the doped region.

Figure 14:
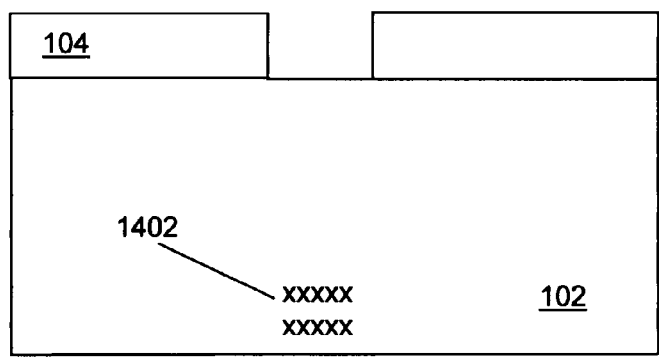
FIG. 14 is a cross-sectional view of a wafer with a patterned masking layer disposed thereon, and a concentration peak of implanted species disposed at a predetermined distance from the surface.
Figure 15:
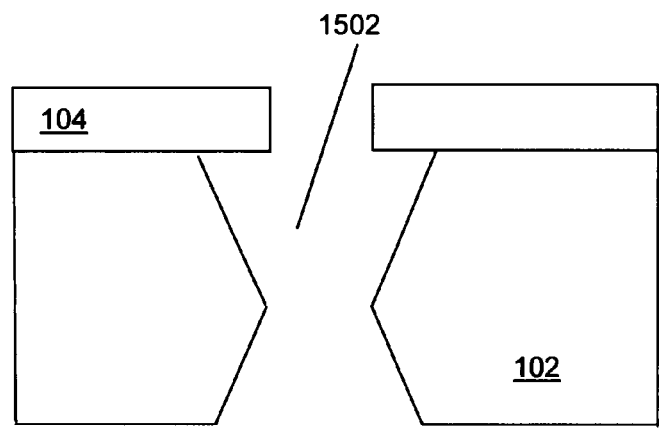
FIG. 15 is a cross-sectional view of the wafer of FIG. 14 after a wet chemical etching operation has been performed.

FIG. 14 is a cross-sectional view of wafer 102 with patterned masking layer 104 disposed thereon, and a concentration peak of implanted species 1402 disposed at a predetermined distance from the surface. FIG. 15 is a cross-sectional view of wafer 102 of FIG. 14 after a wet chemical etching operation has been performed which produces an hour-glass shaped opening 1502. It is noted that lateral etching at the first surface creates the sloped walls that taper in, while the accelerated etching due to the implanted dopant creates the sloped walls that taper out.

Conclusion

Methods of altering etch rate characteristics of materials, and methods of forming structures from those modified materials have been described herein One advantage of some embodiments of the present invention is enabling wet chemical etching to produce trenches with substantially vertical sidewalls.

It is to be understood that the present invention is not limited to the embodiments described above, but encompasses any and all embodiments within the scope of the subjoined Claims and their equivalents.

What is claimed is:

1. A method of removing material from a substrate, comprising:
   providing a substrate of a first material;
   forming a patterned masking layer disposed on the substrate;
   implanting at least one species into a predetermined region of the substrate; and
   exposing the substrate to a wet chemical etchant solution;
   wherein the predetermined region of the substrate has an etch rate in the wet chemical etchant solution that is different than the etch rate of the first material in the wet chemical etchant;
   wherein the first material comprises polysilicon, the at least one species comprises nitrogen dioxide, and the wet chemical etchant solution comprises hydrofluoric acid.

2. The method of claim 1, further comprising removing the patterned masking layer prior to exposing the substrate to a wet chemical etchant solution.

3. The method of claim 1, wherein the predetermined region comprises a vertical shaft region and one or more laterally extending tunnel regions.

4. The method of claim 3 wherein implanting at least one species into a predetermined region of the substrate comprises implanting the at least one species at two or more energies to produce a doping profile corresponding to the vertical shaft region and the one or more laterally extending tunnel regions.

5. The method of claim 1 wherein exposing the substrate to the wet chemical etchant solution produces a trench in the substrate with substantially vertical sidewalls.

6. The method of claim 1, wherein exposing the substrate implanted with nitrogen dioxide to the wet chemical etchant solution produces nitric acid, and the combination of nitric acid and hydrofluoric acid produces a trench in the substrate with substantially vertical sidewalls.

7. A method etching a substrate, comprising:

providing a substrate comprising a first material;

forming an implant mask on a first surface of the substrate;

implanting at least one species of dopant into a predetermined region of the substrate;

annealing the substrate;

forming source/drain regions in the substrate;

exposing the substrate to a wet chemical etchant solution;

wherein the predetermined region of the substrate has an etch rate in the wet chemical etchant solution that is different than the etch rate of the first material in the wet chemical etchant;

wherein the predetermined region comprises a vertical shaft region and one or more laterally extending tunnel regions; wherein implanting at least one species into a predetermined region of the substrate comprises implanting the at least one species at two or more energies to produce a doping profile corresponding to the vertical shaft region and the one or more laterally extending tunnel regions; and wherein the one or more laterally extending tunnel regions are disposed subjacent the source/drain regions.

8. The method of claim 7, wherein the substrate comprises silicon.

9. A method of forming vias through a substrate, comprising:

providing a substrate comprising a first material;

forming an implant mask on a first surface of the substrate, the implant mask having openings through which portions of the substrate are exposed;

implanting, at a plurality of energies, at least one species of dopant into the exposed portions of the substrate;

forming source/drain regions in the substrate;

providing a wet chemical etchant solution to the first surface of the substrate;

wherein the implanted regions of the substrate have an etch rate in the wet chemical etchant solution that is different than the etch rate of the first material in the wet chemical etchant.

10. The method of claim 9 further comprising annealing the substrate.

11. The method of claim 9, wherein the plurality of energies drive the dopant species to a corresponding plurality of depths such that the dopant species is implanted in the substrate from the first surface to a second opposite surface.

12. The method of claim 11, wherein the concentration of implanted dopant species varies with the distance from the first surface.

13. The method of claim 12, wherein a degree of anisotropy achieved by providing the wet chemical etchant solution to the first surface of the substrate is based, at least in part, upon the concentration of the implanted dopant species that varies with the distance.

14. The method of claim 12, wherein the vias have an hour-glass shape.

* * * * *